(12) United States Patent
Chu et al.

(10) Patent No.: US 6,290,631 B2
(45) Date of Patent: *Sep. 18, 2001

(54) METHOD FOR RESTORING AN ALIGNMENT MARK AFTER PLANARIZATION OF A DIELECTRIC LAYER

(75) Inventors: Chih-Hsun Chu; Chin-Hung Tseng, both of Hsinchu (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/237,495

(22) Filed: Jan. 25, 1999

(51) Int. Cl.[7] ........................ H01L 21/302; H01L 21/461
(52) U.S. Cl. .................. 488/692; 694/697; 694/700; 694/712; 694/735; 694/975
(58) Field of Search ................................ 438/401, 462, 438/692, 694, 697, 700, 712, 735, 975

(56) References Cited

U.S. PATENT DOCUMENTS

| | | | | |
|---|---|---|---|---|
| 5,786,260 | * | 7/1998 | Jang et al. | 438/401 |
| 5,843,600 | * | 12/1998 | Chu et al. | 430/22 |
| 5,904,496 | * | 5/1999 | Richards et al. | 438/106 |
| 5,963,816 | * | 10/1999 | Wang et al. | 438/401 |
| 6,015,744 | * | 1/2000 | Tseng | 438/401 |
| 6,037,236 | * | 7/1998 | Jang | 438/401 |

* cited by examiner

Primary Examiner—Benjamin L. Utech
Assistant Examiner—Lynette T. Umez-Eronini
(74) Attorney, Agent, or Firm—Jiawei Huang; J. C. Patents

(57) ABSTRACT

A method for recovering the alignment mark on a substrate to the top of a dielectric layer. The method includes the steps of forming a dielectric layer over a substrate, and then forming a cap layer over the dielectric layer. The cap layer fills the trench in the dielectric layer directly above the alignment mark and covers the area surrounding the trench. Thereafter, a global planarization is carried out to remove the top portion of the cap layer. Finally, the remaining portion of the cap layer is removed to expose the dielectric layer so that an alignment mark re-emerges on top of the dielectric layer.

26 Claims, 5 Drawing Sheets

METHOD FOR RESTORING AN ALIGNMENT MARK AFTER PLANARIZATION OF A DIELECTRIC LAYER

BACKGROUND OF THE INVENTION

1. Field of the Invention

The present invention relates to a method for forming an integrated circuit device. More particularly, the present invention relates to a method capable of restoring the alignment mark on a substrate to the top of a dielectric layer after planarization.

2. Description of Related Art

Photolithography is a critical process in the fabrication of semiconductor devices. Depending on the complexity of the semiconductor device, the number of photoresist depositions and light exposure operations from 10 to 18. Hence, in order to transfer correctly a pattern to a wafer, the photomask must be properly aligned before the photoresist is exposed to light.

In conventional photo-exposure operation, alignment marks must be formed on the silicon wafer so that the alignment marks are able to match with the corresponding marks on the photomask. Step height of an alignment mark is capable of providing a scattering field or a diffraction edge. When a laser light source, for example, a helium-neon (He—Ne) laser having a wavelength of 635 nm shines on the alignment mark, a diffraction pattern is generated. The diffraction pattern can be reflected back and intercepted by an alignment sensor or a first order diffraction interferometer alignment system for recording the positional data. However, if the step height of the alignment mark of the wafer is below a threshold of 200Å, for example, the amount of diffraction generated by the alignment mark is too small to produce a strong alignment signal. In other words, when the noise ratio is too big, return signal from the alignment mark is too weak for the alignment sensor to determine the correct position.

FIGS. 1A through 1C are cross-sectional views showing the steps according to a conventional method of fabricating a semiconductor device. First, as shown in FIG. 1A, a local oxidation of silicon (LOCOS) method or a shallow trench isolation (STI) method is used to provide an isolation region 102 on a substrate 100. Thereafter, an alignment mark 106 is formed by etching the substrate 100 to form a trench 104. The step height 170 or the difference in height level between the upper surface 160 of the substrate 100 and the bottom 150 of the trench 104 is roughly 1000Å. Next, a gate terminal 108 and two source/drain regions 110 are formed in sequence within the active device area bounded by the isolation structure 102. Hence, a field effect transistor 112 is formed. Then, a dielectric layer 114 is formed over the substrate 100 for isolating the field effect transistor 112 from a subsequently formed conductive layer. The dielectric layer 114 can be a silicon oxide layer or a borophosphosilicate glass (BPSG) layer formed using, for example, chemical vapor deposition (CVD).

Next, as shown in FIG. 1B, the dielectric layer 114 is etched to form a contact opening 120 that exposes one of the source/drain regions 110. Thereafter, conductive material such as tungsten is deposited, filling the contact opening 120 and covering the dielectric layer 114 to form a conductive layer 122. The conductive layer 122 couples electrically with the source drain region 110.

Next, as shown in FIG. 1C, a portion of the conductive layer 122 is removed to form a conductive plug 122a that couples electrically with the source/drain region 110. In the subsequent step, another conductive layer is formed over the dielectric layer 114, and the conductive layer is patterned to form a conductive layer 124 directly above the conductive plug 122a. Furthermore, another conductive layer 126 is formed above the alignment mark 106.

The aforementioned method is capable of transferring the alignment mark 106 from the substrate 100 to the dielectric layer 114 and then from the dielectric layer to the conductive layer 126. However, as the degree of integration for integrated circuit devices rises, the number of photoresist depositions and light exposure operations necessary for fabricating the devices will increase correspondingly. To minimize inaccuracy in pattern transfer resulting from a rugged dielectric surface, the dielectric layer 114 is usually planarized using a chemical-mechanical polishing method immediately after its is formed. In general, besides reducing processing difficulties in subsequent operation, planarization of the dielectric layer 114 is able to increase pattern transfer precision in photolithographic processes. FIG. 2A is a cross-sectional view showing the structure after the dielectric layer 114 in FIG. 1A is planarized.

After the dielectric layer 114 is planarized to form a dielectric layer 114a, a conductive plug 122a is formed within the planarized dielectric layer 114a as shown in FIGS. 2B and 2C. As shown in FIG. 2B, a conductive layer 123 is formed over the dielectric layer 114a, and then photolithographic and etching operations are conducted to pattern the conductive layer 123. Consequently, a conductive layer 124 is formed that couples electrically with the conductive plug 122a as shown in FIG. 2C. Because step height 170 of the alignment mark 106 is already lost after the planarization of the dielectric layer 114a, the conductive layer 123 that covers the planarized dielectric layer 114a does not have any step height markings for alignment. To provide the necessary alignment marks for subsequent process, a photoresist layer has to be deposited over the conductive layer 123, and then photomask pattern has to be transferred to the photoresist layer. Finally, a portion of the conductive layer 123 above the alignment mark 106 is etched so that the alignment mark 106 reappears above the dielectric layer 114a. However, the above process of recovering lost alignment marks will increases the number of additional photomask-making and etching operations, thereby increasing production cost and manufacturing time.

In light of the foregoing, there is a need to provide a improved method of recovering the lost alignment mark above the dielectric layer.

SUMMARY OF THE INVENTION

Accordingly, the present invention is to provide a method for restoring the alignment mark on a substrate to the top of a dielectric layer after planarization. The method is capable of restoring the alignment mark on the substrate after the formation of a conductive plug and the planarization of the dielectric layer without additional photolithographic and etching operations. The restored alignment mark is formed on the upper surface of the planarized dielectric layer.

To achieve these and other advantages and in accordance with the purpose of the invention, as embodied and broadly described herein, the invention provides a method for restoring the alignment mark from the substrate to the top of a dielectric layer after planarization. The method includes the steps of forming a dielectric layer over a substrate, and then forming a cap layer over the dielectric layer. The cap layer fills the trench on the upper surface of the dielectric layer directly above the alignment mark and covers the surrounding trench region. Thereafter, a global planarization is carried out to remove the top portion of the cap layer. Finally, the remaining portion of the cap layer is removed so that an alignment mark re-emerges on top of the dielectric layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
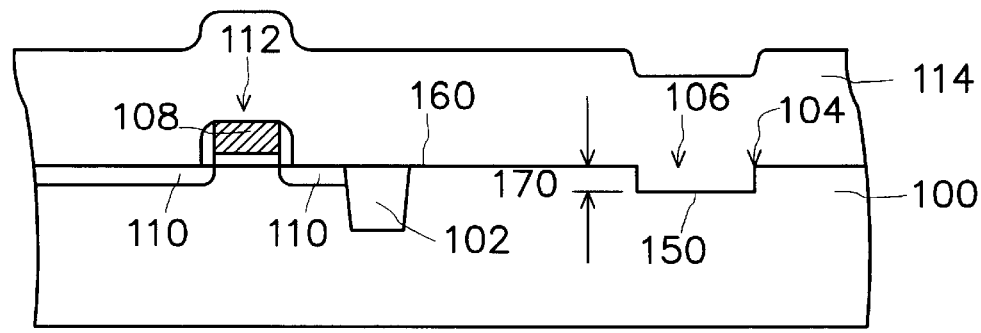
FIGS. 1A through 1C are schematic, cross-sectional views showing the steps according to a conventional method of fabricating a semiconductor device.
Figure 1B:
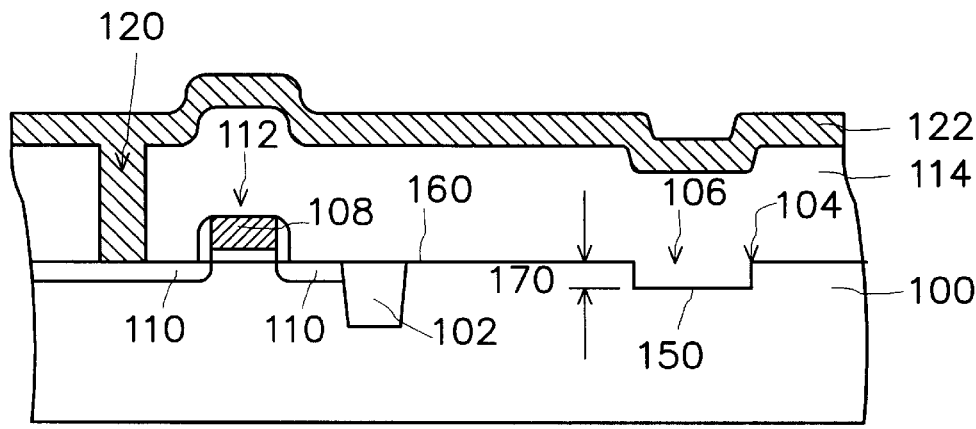
Figure 1C:
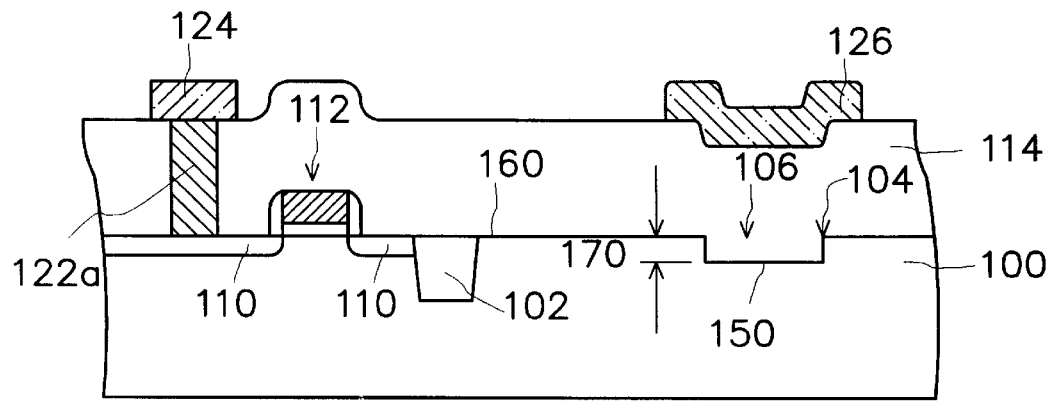
Figure 2A:
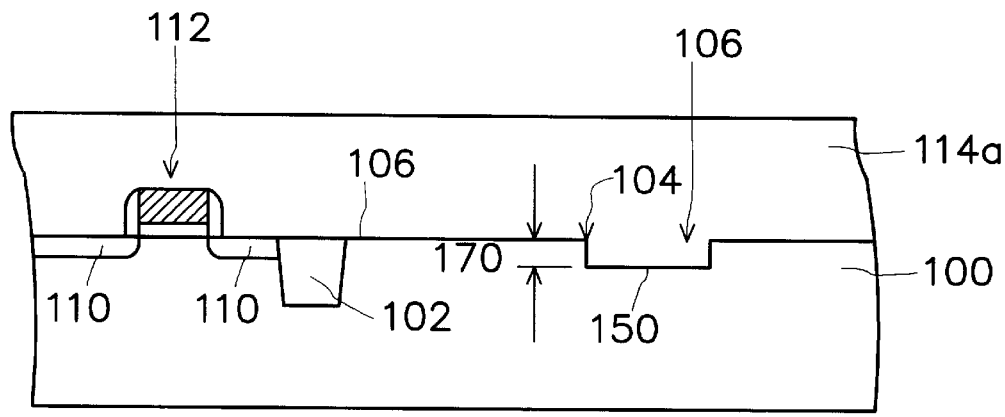
FIGS. 2A through 2C are schematic, cross-sectional views showing the steps according to a conventional method of fabricating a semiconductor device after planarizing the structure as shown in FIG. 1A.
Figure 2B:
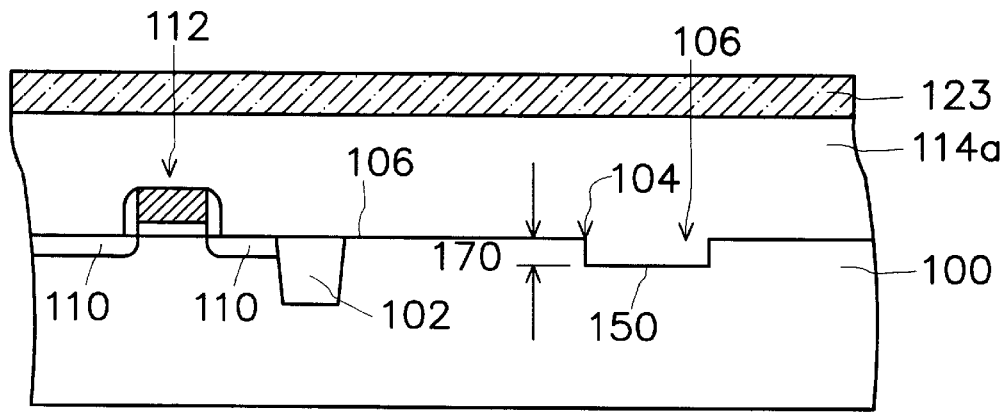
Figure 2C:
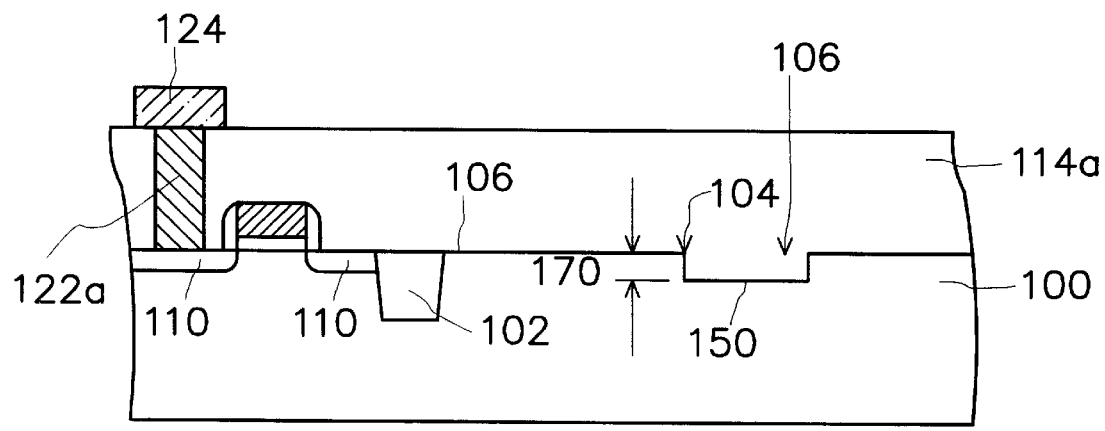

Reference will now be made in detail to the present preferred embodiments of the invention, examples of which are illustrated in the accompanying drawings. Wherever possible, the same reference numbers are used in the drawings and the description to refer to the same or like parts.

Figure 3A:
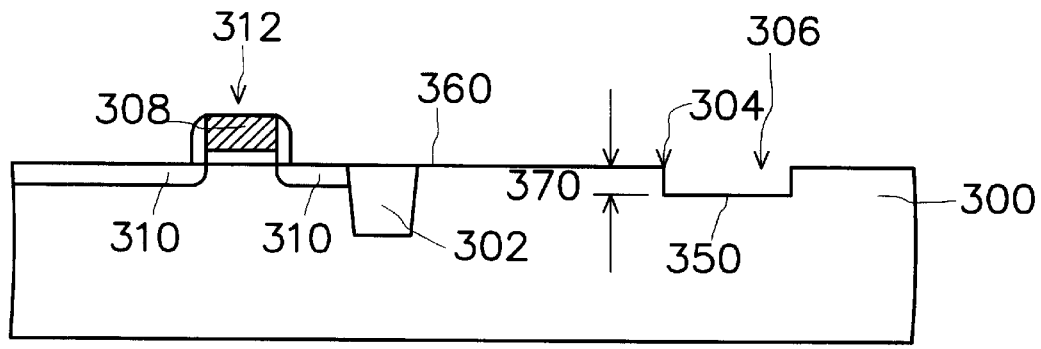
FIGS. 3A through 3F are schematic, cross-sectional views showing the steps in fabricating a semiconductor device having an alignment mark on top of the dielectric layer recovered from the substrate according to one preferred embodiment of this invention.

FIGS. 3A through 3F are schematic, cross-sectional views showing the steps in fabricating a semiconductor device having an alignment mark on top of the dielectic layer recovered from the substrate according to one preferred embodiment of this invention. First, as shown in FIG. 3A, an isolation region 302 is formed in a substrate 300. Then, an alignment mark 306 is formed in the substrate 300 by etching out a trench 304. Next, a gate terminal 308 and two source/drain regions 310 are formed in sequence within the active device area bounded by the isolation structure 302. Hence, a field effect transistor 312 is formed. In general, the isolation region 302 can be a pattern of field oxide layer for making out the active device region. The pattern of field oxide layer is formed using a local oxidation of silicon (LOCOS) method, for example. Alternatively, the isolation region 302 can be shallow trench isolation (STI) formed by etching out a trench in the substrate 300 and then depositing oxide into the trench using a chemical vapor deposition (CVD) method. The step height 370 or the difference in height level between the upper surface 360 of the substrate 300 and the bottom 350 of the trench 304 is roughly 1000Å.

Figure 3B:
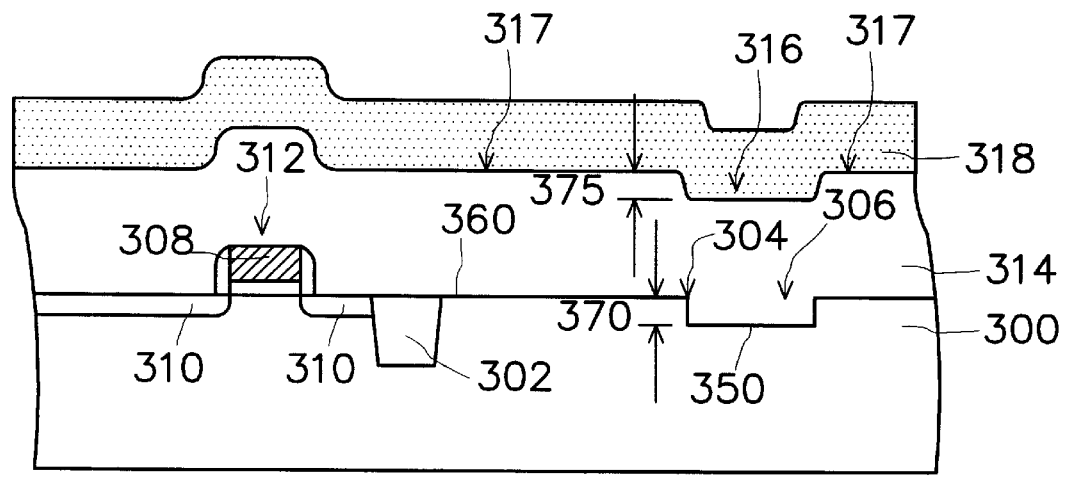

Next, as shown in FIG. 3B, an inter-layer dielectric (ILD) layer 314 is formed over the substrate 300. The ILD layer 314 is used to isolate the field effect transistor 312 and a subsequently deposited conductive layer. Since the bottom 350 of the alignment mark 306 is at a lower level than the upper surface 360 of the substrate 300, a trench 316 will form directly above the alignment mark 306. In general, the trench 316 has a step height 375 similar in magnitude to the original step height 370 of the alignment mark 306. In the subsequent step, a cap layer 318 is formed over the ILD layer 314. The cap layer fills the trench 316 and its surrounding region 317. The ILD layer 314 can be a silicon oxide layer or a borophosphosilicate glass (BPSG) layer formed using, for example, chemical vapor deposition (CVD). The cap layer 318 should be formed from a material having an etching rate that differs from the ILD layer 314. If the ILD layer is a silicon oxide layer, the cap layer 318 is preferably a silicon nitride layer, a polysilicon layer or an amorphous silicon layer. The cap layer 318 can be formed using chemical vapor deposition (CVD), as well.

Figure 3C:
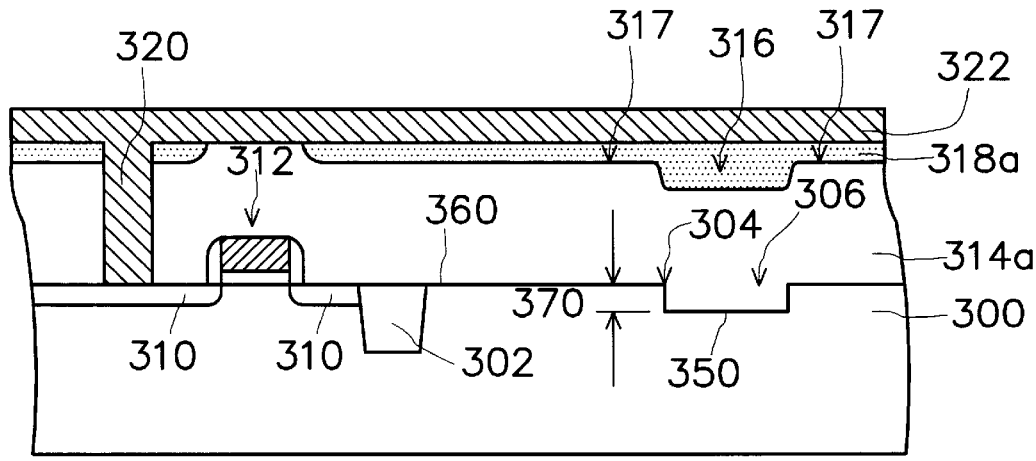

Thereafter, as shown in FIG. 3C, a portion of the IDL layer 314 and a portion of the cap layer 318 are removed by performing a global planarization operation, for example, a chemical-mechanical polishing operation. Preferably, the planarized cap layer 318a still covers the trench 316 and its peripheral region 317 entirely, but the thickness of the cap layer in the peripheral region 317 should be as thin as possible. For example, thickness of cap layer in the peripheral region 317 should be smaller than 300Å. Next, the cap layer 318a and the ILD layer 314a are patterned to form a contact opening 320 that exposes one of the source/drain regions 310. Then, conductive material is deposited filling the contact opening 320 and covering the ILD layer 314a as well as the cap layer 318a to form a conductive layer 322. Hence, an electrical connection with the source/drain region 310 is formed. The conductive layer 322 can be a tungsten layer, for example. Furthermore, a titanium/titanium nitride glue layer can be formed prior to the deposition of tungsten using chemical vapor deposition (CVD) so that adhesion between the tungsten layer and the ILD layer 314a is increased.

Figure 3D:
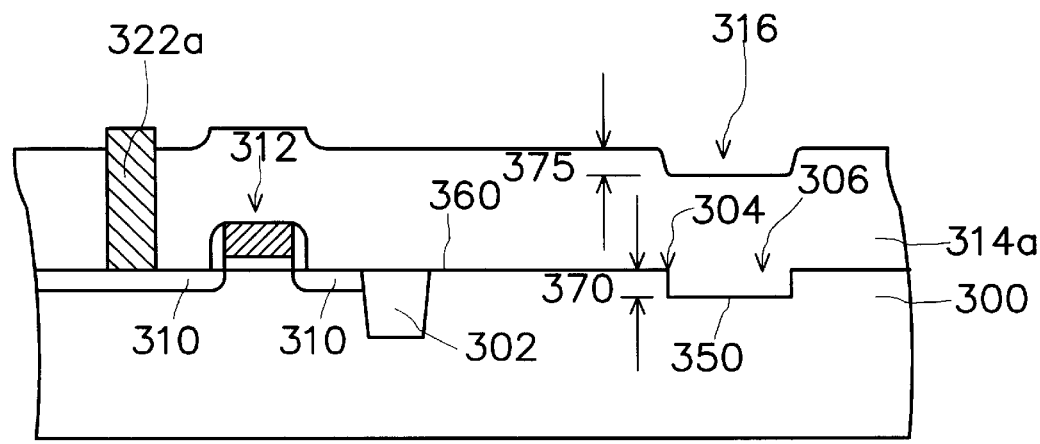

Next, as shown in FIG. 3D, the conductive layer 322 above the ILD layer 314a and the cap layer 318a is removed to form a conductive plug 322a that couples electrically with the source/drain region 310. The conductive layer 322 can be removed using, for example, chemical-mechanical polishing (CMP). Thereafter, the cap layer 318a is removed to expose the dielectric layer 314a including the trench 316. The cap layer 318a can be removed in an anisotropic etching operation using, for example, a reactive ion etching (RIE) method.

Since a layer of cap material still covers the trench 316 and its surrounding region 317 after performing the global planarization operation, a step height 375 in the dielectric layer 314a having a magnitude similar to the step height 370 in the substrate will be restored after the removal of the cap layer 318a. Therefore, the original alignment mark 306 in the substrate 300 having a step height 370 re-emerges as an alignment mark 316 having similar step height 375 above the dielectric layer 310a.

Figure 3E:
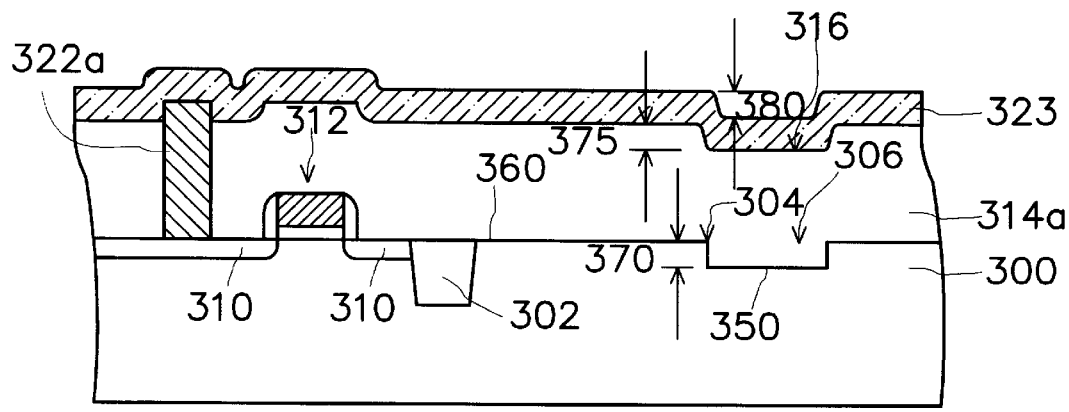

Next, as shown in FIG. 3E, another conductive layer 323 is formed over the ILD layer 314a. The conductive layer 323 can be an aluminum layer formed using physical vapor deposition (PVD).

Figure 3F:
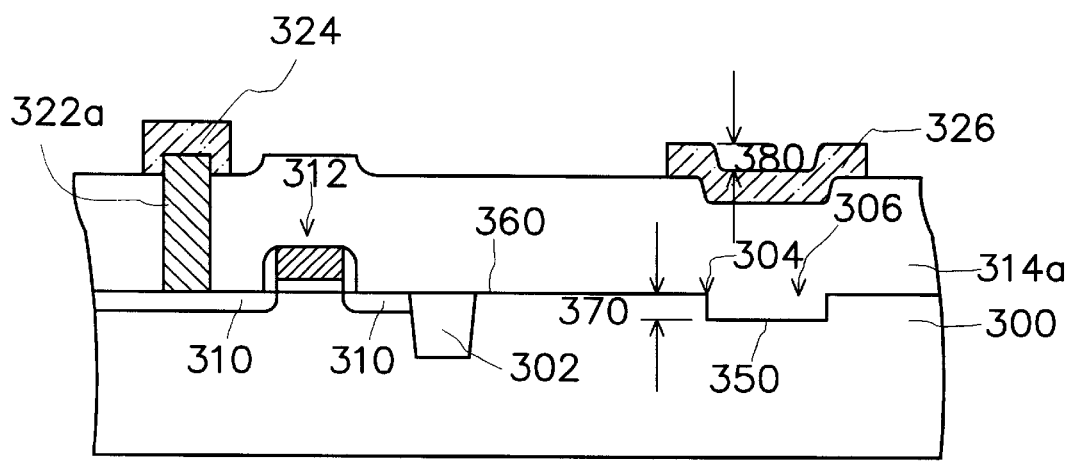

Finally, as shown in FIG. 3F, the conductive layer 323 is patterned to form a conductive layer 324 that couples electrically with the conductive plug 322a and a conductive layer 326 over the dielectric layer 314a above the alignment mark 306. The conductive layer 326 has a trench having a step height 380 similar in magnitude to the step height 370 of the alignment mark 306.

In summary, major aspects of this invention include the capacity to restore the alignment mark on the substrate to the top of the dielectric layer without having to perform additional photolithographic and etching operations. Therefore, the method is capable of saving production time and increasing productivity. Furthermore, although an alignment mark is formed on an inter-layer dielectric layer in the above illustration, the same method can be applied equally to form an alignment mark on inter-metal dielectric (IMD) layer or on an inter-polysilicon dielectric (IPD) layer, as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for recovering the alignment mark on a substrate to the top of a dielectric layer, comprising the steps of:

providing a substrate having an alignment mark thereon;

forming a dielectric layer on the substrate over the alignment mark such that a trench is formed in the dielectric layer directly above the alignment mark;

forming a cap layer over the dielectric layer;

performing a global planarization of the cap layer while retaining a portion of the cap layer over the trench and it surrounding dielectric layer; and removing the cap layer to expose the dielectric layer so that an alignment mark re-emerges on top of the dielectric layer.

2. The method of claim 1, wherein the step of forming the dielectric layer includes depositing dielectric material to form an inter-layer dielectric layer.

3. The method of claim 1, wherein the step of forming the dielectric layer includes depositing dielectric material to form an inter-metal dielectric layer.

4. The method of claim 1, wherein the step of forming the dielectric layer includes depositing dielectric material to form an inter-polysilicon dielectric layer.

5. The method of claim 1, wherein the cap layer and the dielectric layer each has a different etching rate.

6. The claim 3, wherein the cap layer and the dielectric layer each has a different etching rate.

7. The method of claim 4, wherein the cap layer and the dielectric layer each has a different etching rate.

8. The method of claim 5, wherein the step of forming the cap layer includes depositing silicon nitride.

9. The method of claim 5, wherein the step of forming the cap layer includes depositing polysilicon.

10. The method of claim 5, wherein the step of forming the cap layer includes depositing amorphous silicon.

11. The method of claim 1, wherein the step of performing a global planarization of the cap layer includes using chemical-mechanical polishing.

12. The method of claim 1, wherein the thickness of the cap layer within the trench and its surrounding area after the global planarization is about 500Å.

13. The method of claim 1, wherein the step of removing the cap layer includes using reactive ion etching.

14. The method of claim 1, wherein after the step of performing a global planarization of the cap layer but before the step of removing the cap layer, further includes forming a conductive plug in the dielectric layer.

15. A method for recovering the alignment mark on substrate to the top of a dielectric layer, comprising the steps of:

providing a substrate having an alignment mark thereon;

forming a dielectric layer on the substrate over the alignment mark such that a trench is formed in the dielectric layer directly above the alignment mark;

forming a cap layer over the dielectric layer;

performing a global planarization of the cap layer while retaining a portion of the cap layer over the trench and its surrounding dielectric layer;

forming a conductive plug in the dielectric layer; and removing the cap layer to expose the dielectric layer so that an alignment mark re-emerges on top of the dielectric layer.

16. The method of claim 15, wherein the step of forming the dielectric layer includes depositing dielectric material to form an inter-layer dielectric layer.

17. The method of claim 15, wherein the step of forming the dielectric layer includes depositing dielectric material to form an inter-metal dielectric layer.

18. The method of claim 15, wherein the step of forming the dielectric layer includes depositing dielectric material to form an inter-polysilicon dielectric layer.

19. The method of claim 15, wherein the cap layer and the dielectric layer each has a different etching rate.

20. The method of claim 19, wherein the step of forming the cap layer includes depositing silicon nitride.

21. The method of claim 19, wherein the step of forming the cap layer includes depositing polysilicon.

22. The method of claim 19, wherein the step of forming the cap layer includes depositing amorphous silicon.

23. The method of claim 15, wherein the step of performing a global planarization of the cap layer includes using chemical-mechanical polishing.

24. The method of claim 15, wherein the thickness of the cap layer within the trench and its surrounding area after the global planarization is about 500Å.

25. The method of claim 15, wherein the step of removing the cap layer includes using a reactive ion etching method.

26. A method for transferring an alignment mark on a substrate to a dielectric layer, comprising the steps of:

forming the dielectric layer over the substrate, wherein the dielectric layer covers the alignment mark so that a trench corresponding to the alignment mark is formed in the dielectric layer directly above the alignment mark;

forming a cap layer over the dielectric layer;

performing a global planarization of the cap layer while retaining a portion of the cap layer over the trench and its surrounding dielectric layer;

removing the cap layer to expose the dielectric layer so that an alignment mark re-emerges on top of the dielectric layer; and conducting an alignment operation using the alignment mark on the dielectric layer as an alignment target.

* * * * *